United States Patent
Zhu et al.

(10) Patent No.: US 9,344,317 B2
(45) Date of Patent: May 17, 2016

(54) OFDM SIGNAL MODULATION-DEMODULATION METHOD, DEVICE AND SYSTEM BASED ON COMPRESSED SENSING

(71) Applicant: Huawei Technologies Co., Ltd., Shenzhen (CN)

(72) Inventors: Hufei Zhu, Shenzhen (CN); Ganghua Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/944,010

(22) Filed: Nov. 17, 2015

(65) Prior Publication Data

US 2016/0072655 A1    Mar. 10, 2016

Related U.S. Application Data

(63) Continuation of application No. PCT/CN2014/076424, filed on Apr. 29, 2014.

(30) Foreign Application Priority Data

May 17, 2013  (CN) .......................... 2013 1 0185741

(51) Int. Cl.
*H04K 1/00* (2006.01)
*H04L 27/26* (2006.01)

(52) U.S. Cl.
CPC ........ *H04L 27/2646* (2013.01); *H04L 27/2649* (2013.01)

(58) Field of Classification Search
CPC ............ H03M 7/3062; H04L 27/2647; H04L 27/2601; H04L 2012/2841; H04L 2025/03414; H04L 27/2646; H04L 27/2626; H04L 27/2649; H04L 27/2053; H04L 27/2627; H04L 27/26; H04L 27/00; H03D 2200/005; H03D 2200/006
USPC ................. 375/260, 295, 316; 341/155, 144; 327/76.24, 76.38; 455/69
See application file for complete search history.

(56) References Cited

U.S. PATENT DOCUMENTS

2013/0070624 A1*  3/2013  Nguyen .................. H03M 7/30
                                                                  370/252

* cited by examiner

*Primary Examiner* — Rahel Guarino
(74) *Attorney, Agent, or Firm* — Leydig, Voit & Mayer, Ltd.

(57) ABSTRACT

An OFDM signal modulation method based on compressed sensing is provided, the method includes: acquiring a demodulation parameter of a receiver, where the demodulation parameter includes $T_{nyq}$ of a periodic square signal of the receiver in sampling, $T_{nyq}$ is a length of a minimum timeslot during which the periodic square signal maintains a high level or a low level; performing an OFDM modulation on an inputted information symbol to generate an OFDM baseband signal, and controlling a sampling interval $T_{sampleOFDM} = T_s/k$ of the OFDM baseband signal to be integral multiple of $T_{nyq}$, where $T_s$ is a duration of valid data in the OFDM baseband signal, and k is the number of sub-carriers in the OFDM baseband signal; and up-converting the OFDM baseband signal and transmitting the processed signal to the receiver. Also provided are a demodulation method, device and system.

14 Claims, 7 Drawing Sheets

OFDM SIGNAL MODULATION-DEMODULATION METHOD, DEVICE AND SYSTEM BASED ON COMPRESSED SENSING

CROSS-REFERENCE TO RELATED APPLICATIONS

This application is a continuation of International Application No. PCT/CN2014/076424, filed on Apr. 29, 2014, which claims priority to Chinese Patent Application No. 201310185741.7, filed on May 17, 2013, both of which are hereby incorporated by reference in their entireties.

FIELD

The disclosure relates to the field of communications, and in particular to a method for modulating and demodulating an OFDM signal based on compressive sensing, a device and a system thereof.

BACKGROUND

In a conventional art, acquisition and process of a signal in wireless communication are achieved in four steps of sampling, compressing, transmitting and decompressing. Practically, in a case that the signal is compressible, whether the sampling and the compressing are merged into one step is considerable. In 2006, it has been proved by Candes that, a signal can be reconstructed accurately from a part of Fourier transform coefficients of the signal, which is a theoretical basis for the compressive sensing.

A process of the compressive sensing algorithm may be represents by $y=\Phi s$. It is assumed that $y_{200}=\Phi_{200*800}s_{800}$, where s is an original signal and is a column vector with N items, and s has a spare representation. That is to say, after an orthogonal transformation on $\Phi$, $\Phi s=x$ has K ($\ll$N) non-zero items with unknown locations. y is a linear measurement and is a column vector with M items (M$\ll$N and M>2K), and $\Phi$ is a measurement (projection) matrix with M rows and N columns. A condition for accurate reconstruction of the original signal s is as follows. Under the constraint condition $y=\Phi s=\Phi\Psi^H x=Tx$, x with the minimum number of non-zero elements is found, and then $s=\Psi^H x$ is calculated, where $T=\Phi\Psi^H$ is referred to as a sensing matrix.

The reconstructing algorithm based on the compressive sensing is to reconstruct the original signal based on the measurement and the measurement matrix. The process of the reconstruction algorithm is converted to the minimum $l_0$ norm optimization problem described above, which is a NP-hard problem and needs to exhaust all of the infinite possible combination of non-zero x' and thus it is impossible to solve. In industry, it is provided multiple methods for founding the suboptional solution, including the minimum $l_0$ norm method, the matching pursuit method and the like. The implementation complexity of the minimum $l_0$ norm method is generally $O(N^3)$, which is in direct proportion to $N^3$. The implementation complexity of the matching pursuit method may be $O(N)$, which is in direct proportion to N. If the information symbol in the OFDM (Orthogonal Frequency Division Multiplexing, orthogonal frequency division multiplexing, abbreviate to OFDM) baseband signal is reconstructed by using the conventional compressive sensing algorithm, the algorithm used by the receiver is very complex.

SUMMARY

In embodiments of the disclosure, it is provided a method for modulating and demodulating an OFDM signal based on compressive sensing, a device and a system thereof, for solving the deficiency problem of the high complexity in the conventional algorithm.

In an embodiment of the disclosure, it is provided a method for modulating an Orthogonal Frequency Division Multiplexing, OFDM, signal based on compressive sensing, which includes:

acquiring, by a transmitter, demodulation parameters of a receiver, where the demodulation parameters includes $T_{nyq}$ of a periodic square signal used by the receiver in sampling, where $T_{nyq}$ is a length of a minimum timeslot during which the periodic square signal maintains a high level or a low level;

performing, by the transmitter, an OFDM modulation on an input information symbol to generate an OFDM baseband signal, and controlling, a sampling interval $T_{sampleOFDM}=T_s/k$ of the OFDM baseband signal to be integral multiples of $T_{nyq}$, where $T_s$ is a duration of valid data in the OFDM baseband signal, and k is the number of subcarriers in the OFDM baseband signal; and up-converting the OFDM baseband signal and transmitting the up-converted OFDM baseband signal to the receiver by the transmitter.

In a first possible implementation, the process of controlling, by the transmitter, the sampling interval $T_{sampleOFDM}=T_s/k$ of the OFDM baseband signal to be integral multiples of $T_{nyq}$ includes:

controlling, by the transmitter, a sampling interval of the OFDM baseband signal to meet $T_{sampleOFDM}=T_s/k=T_p$, where $T_p$ is a period of the periodic square signal.

In conjunction with the first aspect and the first possible implementation, in a second possible implementation, the method further includes:

determining, by the transmitter, whether a frequency bandwidth of a subcarrier in the OFDM baseband signal is greater than a rated bandwidth B, and setting the subcarrier to be zero in a case that the frequency bandwidth of the subcarrier in the OFDM baseband signal is greater than the rated bandwidth B.

In conjunction with the first aspect and the second possible implementation, in a third possible implementation, the process of acquiring, by the transmitter, the demodulation parameters of the receiver includes:

receiving signaling information including demodulation parameters transmitted from the receiver; and parsing the signaling information to obtain the demodulation parameters.

In a second aspect of the disclosure, it is provided a method for demodulating an OFDM signal based on compressive sensing in a wireless communication system, which includes:

receiving a high-frequency signal transmitted from a transmitter, where a sampling interval $T_{sampleOFDM}=T_s/k$ of an OFDM baseband signal corresponding to the high-frequency signal is integral multiples of $T_{nyq}$ when being modulated by the transmitter, where $T_s$ is a duration of valid data in the OFDM baseband signal, k is the number of subcarriers in the OFDM baseband signal, and $T_{nyq}$ is a length of a minimum timeslot during which the periodic square signal maintains a high level or a low level;

dividing the high-frequency signal into m branches;

multiplying each of the m branches with a periodic square signal with a period of $T_p$ to obtain m mixed signals;

filtering and sampling each of the m mixed signals to obtain a sampling vector;

deriving a frequency-domain sparse vector from the sampling vector according to a compressive sensing signal reconstruction algorithm; and reconstructing an information symbol in the OFDM baseband signal corresponding to the high-frequency signal based on a non-zero term of the frequency-domain sparse vector.

In a first possible implementation, the periodic square signal is a random periodic square signal.

In conjunction with the second aspect and the first possible implementation, in a second possible implementation, the process of filtering and sampling each of the m mixed signals to obtain the sampling vector includes:

filtering and sampling each of the m mixed signals to obtain the sampling vector, where a cut-off frequency for the filtering is $f_s/2$ and a sampling frequency for the sampling is $f_s$, where $f_s=1/T_n$.

In a third aspect of the disclosure, it is provided a transmitter in a wireless communication system, which includes:

an acquisition module, configured to acquire demodulation parameters of a receiver, where the demodulation parameters includes $T_{nyq}$ of a periodic square signal used by the receiver in sampling, where $T_{nyq}$ is a minimum timeslot during which the periodic square signal maintains a high level or a low level;

a control module, configured to perform an OFDM modulation an on input information symbol to generate an OFDM baseband signal, and control a sampling interval $T_{sampleOFDM}=T_s/k$ of the OFDM baseband signal to be integral multiples of $T_{nyq}$, where $T_s$ is a duration of valid data in the OFDM baseband signal, and k is the number of subcarriers in the OFDM baseband signal; and a transmission module, configured to up-convert the OFDM baseband signal and transmit the up-converted OFDM baseband signal to the receiver.

In a first possible implementation, the control module is further configured to control a sampling interval of the OFDM baseband signal to meet $T_{sampleOFDM}=T_s/k=T_p$, where $T_p$ is a period of the periodic square signal.

In conjunction with the third aspect and the first possible implementation, in a second possible implementation, the transmitter further includes:

a bandwidth adjustment module, configured to determine whether a frequency bandwidth of a subcarrier in the OFDM baseband signal is greater than a rated bandwidth B, and set the subcarrier to be zero in a case that the frequency bandwidth of the subcarrier in the OFDM baseband signal is greater than the rated bandwidth B.

In conjunction with the third aspect and the second possible implementation, in a third possible implementation, the acquisition module includes:

a signaling reception unit, configured to receive signaling information including the demodulation parameters transmitted from the receiver; and a parameter analysis unit, configured to parse the signaling information to obtain the demodulation parameters.

In a fourth aspect of the disclosure, it is provided a receiver in a wireless communication system, which includes:

a reception module, configured to receive a high-frequency signal transmitted from a transmitter, where a sampling interval $T_{sampleOFDM}=T_s/k$ of an OFDM baseband signal corresponding to the high-frequency signal is integral multiples of $T_{nyq}$ when being modulated by the transmitter, where $T_s$ is a duration of valid data in the OFDM baseband signal, k is the number of subcarriers in the OFDM baseband signal, and $T_{nyq}$ is a length of a minimum timeslot during which the periodic square signal maintains a high level or a low level;

a power division module, configured to divide the high-frequency signal into m branches;

a mixing module, configured to multiply each of the m branches with a periodic square signal with a period of $T_p$ to obtain m mixed signals;

a filtering and sampling module, configured to filter and sample each of the m mixed signals to obtain a sampling vector;

a spare vector calculation module, configured to derive a frequency-domain sparse vector from the sampling vector according to a compressive sensing signal reconstruction algorithm; and a symbol reconstruction module, configured to reconstruct an information symbol in the OFDM baseband signal corresponding to the high-frequency signal based on a non-zero term of the frequency-domain sparse vector.

In a first possible implementation, the periodic square signal is a random periodic square signal.

In conjunction with the fourth aspect and the first possible implementation, in a second possible implementation, the filtering and sampling module is further configured to filter and sample each of the m mixed signals to obtain a sampling vector, where a cut-off frequency for the filtering is $f_s/2$ and a sampling frequency for the sampling is $f_s$, where $f_s=1/T_n$.

In a fifth aspect of the disclosure, it is provided a communication system for an OFDM signal based on compressive sensing, which includes any one of the transmitters described above and any one of the receivers described above.

By implementing the embodiments of the disclosure, following benefit effects are obtained.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

DETAILED DESCRIPTION OF THE EMBODIMENTS

Figure 1:
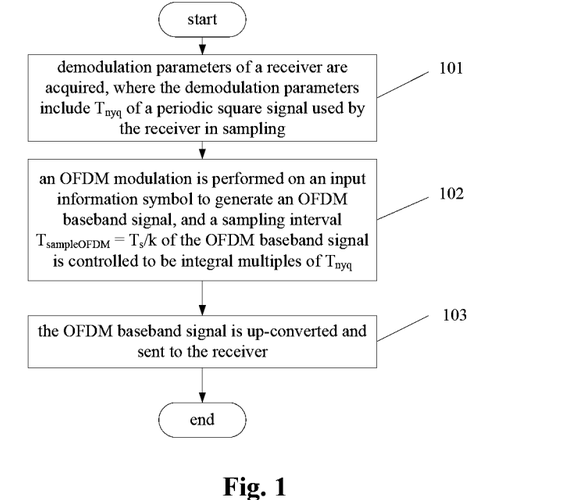
FIG. 1 is a schematic flow chart of a method for modulating an OFDM signal based on compressive sensing according to an embodiment of the disclosure.

In the embodiments of the disclosure, it is described a solution for process a signal in a wireless communication system, especially in a system in which the OFDM may be applied. Referring to FIG. 1, which is a schematic flow chart of a method for modulating an OFDM signal based on compressive sensing according to an embodiment of the disclosure, the method is generally performed on a transmitter in a system, and the method includes following steps 101 to 103.

In step 101, demodulation parameters of a receiver are acquired, where the demodulation parameters include $T_{nyq}$ of a periodic square signal used by the receiver in sampling.

Specifically, the transmitter acquires the demodulation parameters of the receiver as follows. The transmitter directly calls the preset demodulation parameters of the receiver according to a preset communication protocol. Alternatively, the receiver transmits signaling to the transmitter, to make the transmitter acquires the demodulation parameters of the receiver. The demodulation parameters are used by the receiver to demodulate a received radio frequency signal including the OFDM baseband signal. The demodulation parameters include $T_{nyq}$ of the periodic square signal used by the receiver in sampling.

The receiver demodulates the received high-frequency signal including the OFDM baseband signal based on a compressive sensing reconstruction algorithm as follow. The receiver receives the high-frequency signal transmitted by the transmitter; divides the high-frequency signal into m branches; multiplies each of the m branches with the periodic square signal with a period of $T_p$ to obtain m mixed signals; filters and samples each of the m mixed signals to obtain a sampling vector; derives a frequency-domain sparse vector from the sampling vector according to the compressive sensing signal reconstruction algorithm; and reconstructs an information symbol in the OFDM baseband signal corresponding to the high-frequency signal based on a non-zero term of the frequency-domain sparse vector. $T_{nyq}$ is a length of a minimum timeslot during which the periodic square signal maintains a high level or a low level, and $T_{nyq}$ is calculated as $T_{nyq}=T_p/M$, where M is the number of the periodic square signals within one period.

In step 102, an OFDM modulation is performed on an input information symbol to generate an OFDM baseband signal, and a sampling interval $T_{sampleOFDM}=T_s/k$ of the OFDM baseband signal is controlled to be integral multiples of $T_{nyq}$.

Specifically, the transmitter performs the OFDM modulation on the input information symbol, which is a digital signal. The OFDM modulation is known in the conventional art and is not described here. The receiver performs a serial-to-parallel conversion on the information symbol to divide the information symbol into multiple branches, and the signal in each of the branches is modulated onto a subcarrier and then encounters an IFFT process, a parallel-to-serial conversion, a cyclic prefix addition, and a Digital-to-Analog Converter (DAC) process to generate an OFDM baseband signal. During the modulation, the receiver controls $T_{sampleOFDM}=T_s/k$ to be integral multiples of $T_{nyq}$, where $T_s$ is a duration of valid data in the OFDM baseband signal, and k is the number of subcarriers in the OFDM baseband signal.

In this step, in the process of performing the OFDM modulation on the information symbol based on the priori condition (the demodulation parameter) of the receiver, the transmitter controls the sampling interval $T_{sampleOFDM}=T_s/k$ of the OFDM baseband signal to be integral multiples of $T_{nyq}$, so that when the receiver demodulates the high-frequency signal including the OFDM baseband signal based on the compressive sensing algorithm, based on the coincidence between the frequency points corresponding to the non-zero items of the frequency-domain spare vector and the frequency points of the subcarriers in the OFDM baseband signal, the non-zero items of the frequency-domain spare vector which are reconstructed based on the compressive reconstruction algorithm and correspond to each of the subcarriers in the OFDM baseband signal are found, and the non-zero items are the estimation of the information symbols carried by the subcarrier, thereby reducing the complexity of the receiver significantly.

In step 103, the OFDM baseband signal is up-converted and transmitted to the receiver.

Specifically, the transmitter modulates the OFDM baseband signal to generate a radio frequency signal suitable for transmission in a wireless channel and transmits the radio frequency signal to the receiver.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 2:
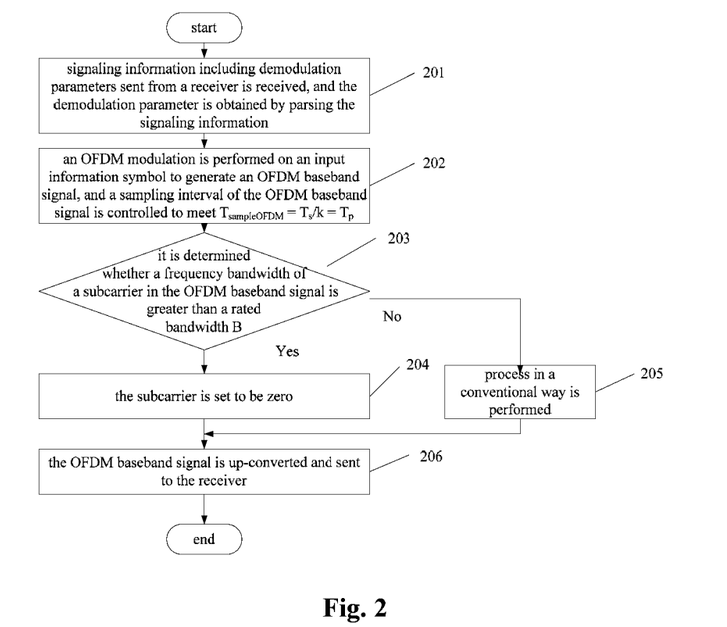
FIG. 2 is a schematic flow chart of another method for modulating an OFDM signal based on compressive sensing according to an embodiment of the disclosure.

Referring to FIG. 2, which is a schematic flow chart of another method for modulating an OFDM signal based on compressive sensing according to an embodiment of the disclosure, the method includes following steps 201 to 206.

In step 201, signaling information including demodulation parameters transmitted from a receiver is received, and the demodulation parameter is obtained by parsing the signaling information. The demodulation parameters of the receiver include the period $T_p$ of the periodic square signal used by the receiver, and the maximum bandwidth B of the narrow-band signals transmitted by the transmitter as desired by the receiver, where generally, $B<f_p=1/T_p$.

Specifically, the transmitter acquires the demodulation parameters on the side of the receiver as follows. The transmitter directly calls the preset demodulation parameters of the receiver according to a preset communication protocol. Alternatively, the receiver transmits signaling to the transmitter, to make the transmitter acquires the demodulation parameters of the receiver. The demodulation parameters are used by the receiver to demodulate a received high-frequency signal including the OFDM baseband signal. The demodulation parameters include $T_{nyq}$ of the periodic square signal used by the receiver in sampling. The demodulation parameters of the receiver may be acquired in other ways, which are not limited thereto.

The receiver demodulates the received high-frequency signal including the OFDM baseband signal based on a compressive sensing reconstruction algorithm as follow. The receiver receives the high-frequency signal transmitted by the transmitter; divides the high-frequency signal into m branches; multiplies each of the m branches with the periodic square signal with a period of $T_p$ to obtain m mixed signals; filters and samples each of the m mixed signals to obtain a sampling vector; derives a frequency-domain sparse vector from the sampling vector according to the compressive sensing signal reconstruction algorithm; and reconstructs an information symbol in the OFDM baseband signal corresponding to the high-frequency signal based on a non-zero term of the frequency-domain sparse vector. $T_{nyq}$ is a length of a minimum timeslot during which the periodic square signal maintains a high level and a low level, and $T_{nyq}$ is calculated as $T_{nyq}=T_p/M$, where M is the number of the periodic square signals within one period.

In step 202, an OFDM modulation is performed on an input information symbol to generate an OFDM baseband signal, and a sampling interval of the OFDM baseband signal is controlled to meet $T_{sampleOFDM}=T_s/k=T_p$.

Specifically, the transmitter controls the sampling interval of the OFDM baseband signal to meet $T_{sampleOFDM}=T_s/k=T_p$, where $T_s$ is a duration of valid data in the OFDM baseband signal, and k is the number of subcarriers in the OFDM baseband signal.

In step 203, it is determined whether a frequency bandwidth of a subcarrier in the OFDM baseband signal is greater than a rated bandwidth B.

Specifically, if it is determined that the frequency band of any one of the subcarriers in the OFDM baseband signal is greater than the frequency band defined by the rated bandwidth B, step 204 is performed; otherwise, step 205 is performed.

In step 204, the subcarrier is set to be zero.

In step 205, process in a conventional way is performed.

In step 206, the OFDM baseband signal is up-converted and transmitted to the receiver.

Specifically, it is assumed that the transmitter generates two narrow-band OFDM baseband signals, which are respectively up-converted to 2*fp and 15*fp and transmitted to the receiver. The OFDM modulation with a bandwidth of $f_p$ ($f_p$ is a frequency of a periodic variation of the periodic square signal) is performed on each of the OFDM baseband signals. And in the OFDM baseband signal, the subcarrier with the frequency band greater than B is set to be zero, so that the actual bandwidth of the OFDM baseband signal is less than B. For example, for the baseband signal, the frequency band with the bandwidth less than or equal to B generally refers to the frequency band with the bandwidth within the range of −B/2 to B/2; for any subcarrier with the central point of $f_{subcarrier\_i}$ and the bandwidth of $\Delta f=1/T_s$, the bandwidth of the frequency band of the subcarrier is within the range of $f_{subcarrier\_i}-\Delta f/2$ to $f_{subcarrier\_i}+\Delta f/2$, and any part of this frequency band is out of the frequency band with the bandwidth within the range of −B/2 to B/2, which means that the frequency band of this subcarrier is greater than or equal to B.

The information symbol to be transmitted encounters a subcarrier modulation, an IFFT (Inverse Fast Fourier Transform, inverse fast transform, abbreviate to IFFT), a parallel-to-serial conversion, a cyclic prefix addition and a DA converter process and is transmitted at the sampling interval $T_{sampleOFDM}=T_s/k$. $T_s$ is a duration of valid data in the OFDM baseband signal, i.e., the symbol length after the cyclic prefix is removed, and k is the number of subcarriers in the OFDM baseband signal. At last, the OFDM baseband signal is up-converted and is transmitted via the RF device. Based on the OFDM modulation principle, the minimum frequency space between the subcarriers meets $\Delta f=1/T_s$.

It is assumed that the number of the subcarriers is k=101, the transmitter performs the OFDM modulation with the bandwidth of $f_p$ ($f_p$ is a frequency of a periodic variation of the periodic square signal), the frequency of the subcarriers in the OFDM baseband signal is $\Delta f=f_p/N_{FFT}=10G/195/k=10G/195/101\approx0.5077$ MHz. Accordingly, the duration of the valid data in the OFDM baseband signal is $T_s=1/\Delta f=k/f_p$, and the sampling interval of the DA converter of the transmitter is $T_{sampleOFDM}=T_s/k=k*f_p/k=1/f_p=T_p$. For details and more related parameters of the receiver adopted in the disclosure, reference may be made to "Moshe Mishali, Yonina C. Eldar, "From Theory to Practice: Sub-Nyquist Sampling of Sparse Wideband Analog Signals", IEEE JOURNAL OF SELECTED TOPICS IN SIGNAL PROCESSING, VOL. 4, NO. 2, APRIL 2010.

The transmitter performs the OFDM modulation with the bandwidth of $f_p$, and to make the actual bandwidth of the OFDM baseband signal less than B=50M, among the k=101 subcarriers, the four subcarriers with the highest frequency are set to be zero, only 101−4=97 subcarriers are used to transmit the information symbol actually, and the actual bandwidth of the OFDM baseband signal is verified to be less than B=50M.

After the above OFDM demodulation process by the transmitter, the receiver adopting the compressive sensing technique, obtains sampling values related to the OFDM baseband signal are by using low-rate ADC. There are two segments of frequency-domain spare vectors that is reconstructed using the Orthogonal Matching Pursuit OMP method, and the frequency-domain spare vectors has many non-zero items, with each segment the including 101 items. For each of the segments of the frequency-domain spare vectors, the four items with the highest frequency are removed, and 97 items are remained, which are the estimation of the information symbols carried by the two OFDM baseband signals. The receiver may also adopt other compressive sensing signal reconstruction method to reconstruct the frequency-domain spare vector. Particularly, in a case that the receivers knows the frequency bands of the narrow-band signals transmitted by the transmitter, the receiver may reconstruct the frequency-domain spare vector or only find the frequency-domain vector in the concerned frequency band using a simple signal processing method instead of the compressive sensing signal reconstruction method, which are all known in the conventional art.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 3:
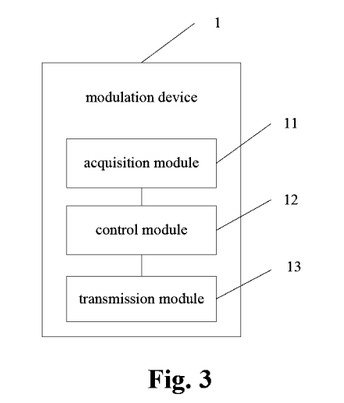
FIG. 3 is a schematic structural diagram of a device for modulating an OFDM signal based on compressive sensing according to an embodiment of the disclosure.

Referring to FIG. 3, which is a schematic structural diagram of a device for modulating an OFDM signal based on compressive sensing according to an embodiment of the disclosure, the device is referred to as a modulation device 1 hereinafter, the modulation device 1 may be a transmitter in a wireless communication system and is configured to process and transmit a communication signal, and the modulation device 1 includes an acquisition module 11, a control module 12 and a transmission module 13.

The acquisition module 11 is configured to acquire demodulation parameters of a receiver, where the demodulation parameters includes $T_{nyq}$ of a periodic square signal used by the receiver in sampling, where $T_{nyq}$ is a length of a minimum timeslot during which the periodic square signal maintains a high level or a low level.

The control module 12 is configured to perform an OFDM modulation on an input information symbol to generate an OFDM baseband signal, and control a sampling interval $T_{sampleOFDM}=T_s/k$ of the OFDM baseband signal to be integral multiples of $T_{nyq}$, where $T_s$ is a duration of valid data in the OFDM baseband signal, and k is the number of subcarriers in the OFDM baseband signal.

The transmission module 13 is configured to up-convert the OFDM baseband signal and transmit the up-converted OFDM baseband signal to the receiver.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 4:
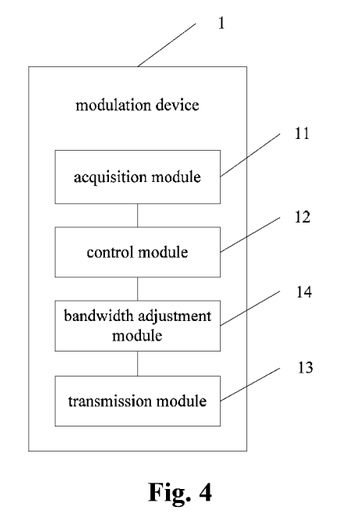
FIG. 4 is a schematic structural diagram of another device for modulating an OFDM signal based on compressive sensing according to an embodiment of the disclosure.
Figure 5:
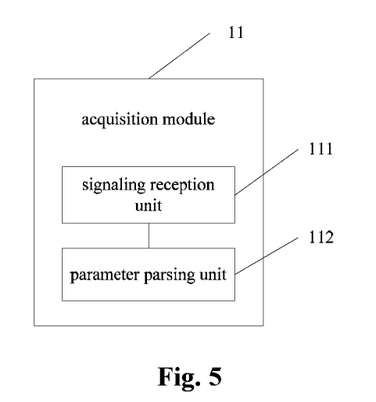
FIG. 5 is a schematic structural diagram of an acquisition module in FIG. 4.

Further, referring to FIG. 4 and FIG. 5, which are schematic structural diagrams of another device for modulating an OFDM signal based on compressive sensing according to an embodiment of the disclosure. Besides the acquisition module 11, the control module 12 and the transmission module 13, the modulation device 1 further includes a bandwidth adjustment module 14. The bandwidth adjustment module 14 is configured to determine whether a frequency bandwidth of a subcarrier in the OFDM baseband signal is greater than a rated bandwidth B, and set the subcarrier to be zero in a case of a positive determination.

Preferably, the acquisition module 11 includes:

a signaling reception unit 111, configured to receive signaling information including demodulation parameters transmitted from the receiver; and a parameter parsing unit 112, configured to parse the signaling information to obtain the demodulation parameters.

The control module 12 is further configured to control a sampling interval of the OFDM baseband signal to meet $T_{sampleOFDM}=T_s/k=T_p$, where $T_p$ is a period of the periodic square signal.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 6:
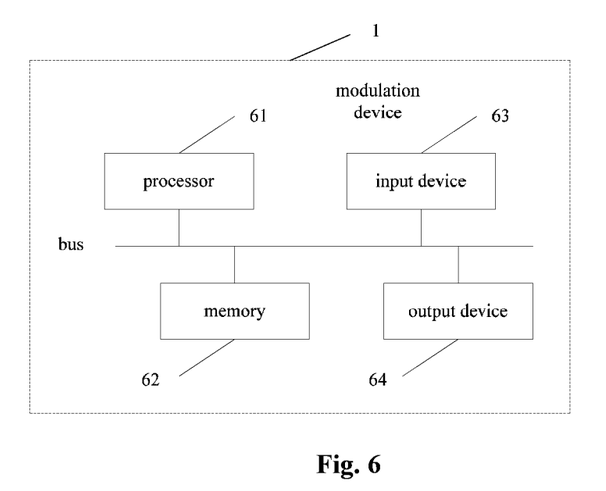
FIG. 6 is a schematic structural diagram of yet another device for modulating an OFDM signal based on compressive sensing according to an embodiment of the disclosure.

Referring to FIG. 6, which is a schematic structural diagram of yet another device for modulating an OFDM signal based on compressive sensing according to an embodiment of the disclosure. The modulation device 1 includes a processor 61, a memory 62, an input device 63 and an output device 64. The modulation device 1 may include one or more processors 61, and one processor 61 is taken as an example in FIG. 6. In some embodiments of the disclosure, the processor 61, the memory 62, the input device 63 and the output device 64 may be connected via a bus or other ways, and the bus connection is taken as an example in FIG. 6.

A block of program code is stored in the memory 62, and the processor 61 is configured to call the program code stored in the memory 62 to:

acquire demodulation parameters of a receiver, where the demodulation parameters includes $T_{nyq}$ of a periodic square signal used by the receiver in sampling, where $T_{nyq}$ is a length of a minimum timeslot during which the periodic square signal maintains a high level and a low level;

perform an OFDM modulation on an input information symbol to generate an OFDM baseband signal, and control a sampling interval $T_{sampleOFDM}=T_s/k$ of the OFDM baseband signal to be integral multiples of $T_{nyq}$, where $T_s$ is a duration of valid data in the OFDM baseband signal, and k is the number of subcarriers in the OFDM baseband signal; and up-convert the OFDM baseband signal and transmit the up-converted OFDM baseband signal to the receiver.

In some embodiments of the disclosure, the step of the processor 61 controlling the sampling interval $T_{sampleOFDM}=T_s/k$ of the OFDM baseband signal to be integral multiples of $T_{nyq}$ includes:

the processor 61 controls a sampling interval of the OFDM baseband signal to meet $T_{sampleOFDM}=T_s/k=T_p$, where $T_p$ is a period of the periodic square signal.

In some embodiments of the disclosure, the processor 61 is further configured to determine whether a frequency bandwidth of a subcarrier in the OFDM baseband signal is greater than a rated bandwidth B, and set the subcarrier to be zero in a case of a positive determination.

In some embodiments of the disclosure, the step of the processor 61 acquiring the demodulation parameters of the receiver includes:

the processor 61 receives signaling information including demodulation parameters transmitted from the receiver; and the processor 61 parses the signaling information to obtain the demodulation parameters.

By implementing the embodiments of the disclosure, the length of the minimum timeslot is acquired during which the periodic square signal used by the receiver in demodulation maintains a high level or a low level, the sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 7:
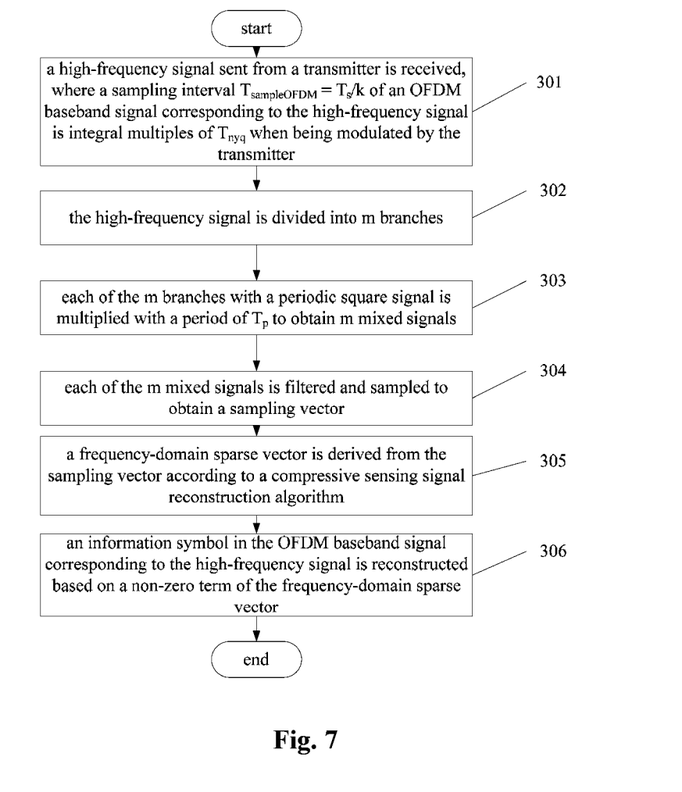
FIG. 7 is a schematic flow chart of a method for demodulating an OFDM signal based on compressive sensing according to an embodiment of the disclosure.

Referring to FIG. 7, which is a schematic flow chart of a method for demodulating an OFDM signal based on compressive sensing according to an embodiment of the disclosure, the method includes following steps 301 to 306.

In step 301, a high-frequency signal transmitted from a transmitter is received, where a sampling interval $T_{sampleOFDM}=T_s/k$ of an OFDM baseband signal corresponding to the high-frequency signal is integral multiples of $T_{nyq}$ when being modulated by the transmitter.

Specifically, it is assumed that the high-frequency signal is x(t), the sampling interval $T_{sampleOFDM}=T_s/k$ of the OFDM baseband signal corresponding to x(t) is integral multiples of $T_{nyq}$ when being modulated by the transmitter.

In step 302, the high-frequency signal is divided into m branches.

In step 303, each of the m branches with a periodic square signal is multiplied with a period of $T_p$ to obtain m mixed signals.

Specifically, for an i-th branch, it is assumed that the periodic square signal is $P_i(t)$, i=1, 2, ..., m, the i-th mixed signal is $x_i(t)=x(t)*P_i(t)$, where $P_i(t)$ is a random periodic square signal and meets $P_i(t+n*T_p)=P_i(t)$, and n is a positive integer.

In step 304, each of the m mixed signals is filtered and sampled to obtain a sampling vector.

Specifically, the receiver filters and samples each of the m mixed signals to obtain a sampling vector, where a cut-off frequency for the filtering is $f_s/2$ and a sampling frequency for the sampling is $f_s$, and $f_s=1/T_n$.

In step 305, a frequency-domain sparse vector is derived from the sampling vector according to a compressive sensing signal reconstruction algorithm.

In step 306, an information symbol in the OFDM baseband signal corresponding to the high-frequency signal is reconstructed based on a non-zero term of the frequency-domain sparse vector.

Specifically, in the process of performing the OFDM modulation on the information symbol based on the priori condition (the demodulation parameters) of the receiver, the transmitter controls the sampling interval $T_{sampleOFDM}=T_s/k$ of the OFDM baseband signal to be integral multiples of $T_{nyq}$, so that when the receiver demodulates the high-frequency signal including the OFDM baseband signal based on the compressive sensing algorithm, based on the coincidence between the frequency points corresponding to the non-zero items of the frequency-domain spare vector and the frequency points of the subcarriers in the OFDM baseband signal, the non-zero items of the frequency-domain spare vector which are reconstructed based on the compressive reconstruction algorithm and correspond to each of the subcarriers in the OFDM baseband signal are found, and the non-zero items are the estimation of the information symbols carried by the subcarrier, thereby reducing the complexity of the receiver significantly.

By implementing the embodiments of the disclosure, the sampling interval of the OFDM baseband signal of the transmitter is controlled to be the length of the minimum timeslot during which the periodic square signal used by the receiver in demodulation maintains a high level or a low level, the sampling interval of the OFDM baseband signal is controlled to be integral multiples of the length of the minimum timeslot. Based on the baseband signal after the above process, the information symbol input into the receiver is reconstructed by the receiver using the compressive sensing reconstruction algorithm, and the complexity of the algorithm is reduced significantly.

Figure 8:
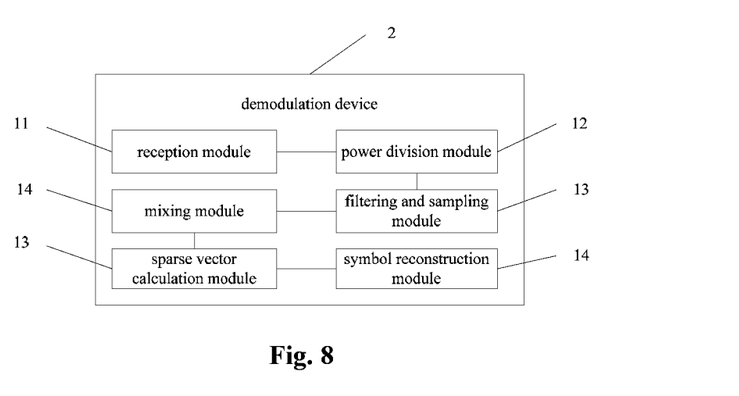
FIG. 8 is a schematic structural diagram of a device for demodulating an OFDM signal based on compressive sensing according to an embodiment of the disclosure.

Referring to FIG. 8, which is a schematic structural diagram of a device for demodulating an OFDM signal based on compressive sensing according to an embodiment of the disclosure, the device is referred to as a demodulation device 2 hereinafter. The demodulation device 2 may be a receiver in a wireless communication system and configured to process and receive a communication signal, and the demodulation device 2 includes:

a reception module 21, configured to receive a high-frequency signal transmitted by a transmitter, where a sampling interval $T_{sampleOFDM}=T_s/k$ of an OFDM baseband signal corresponding to the high-frequency signal is integral multiples of $T_{nyq}$ when being modulated by the transmitter, where $T_s$ is a duration of valid data in the OFDM baseband signal, k is the number of subcarriers in the OFDM baseband signal, and $T_{nyq}$ is a length of a minimum timeslot during which the periodic square signal maintains a high level or a low level;

a power division module 22, configured to divide the high-frequency signal into m branches;

a mixing module, configured to multiply each of the m branches with a periodic square signal with a period of $T_p$ to obtain m mixed signals;

a filtering and sampling module 23, configured to filter and sample each of the m mixed signals to obtain a sampling vector;

a sparse vector calculation module 24, configured to derive a frequency-domain sparse vector from the sampling vector according to a compressive sensing signal reconstruction algorithm; and a symbol reconstruction module 25, configured to reconstruct information symbol in the OFDM baseband signal corresponding to the high-frequency signal based on a non-zero term of the frequency-domain sparse vector.

By implementing the embodiments of the disclosure, the sampling interval of the OFDM baseband signal of the transmitter is controlled to be the length of the minimum timeslot during which the periodic square signal used by the receiver in demodulation maintains a high level or a low level. The sampling interval of the OFDM baseband signal is controlled to be integral multiples of the length of the minimum timeslot. Based on the above baseband signal after the above process, the information symbol input into the receiver is reconstructed by the receiver using the compressive sensing reconstruction algorithm, and the complexity of the algorithm is reduced significantly.

Figure 9:
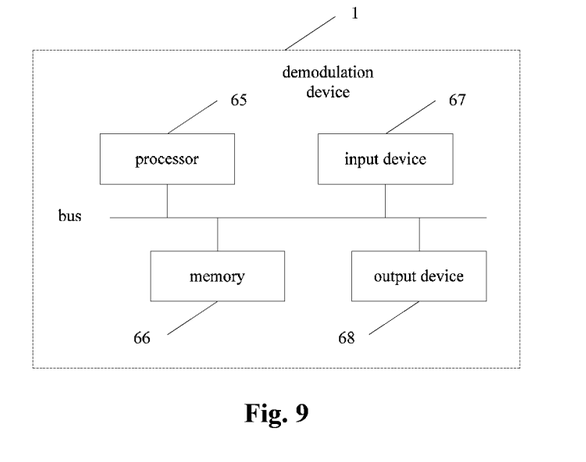
FIG. 9 is a schematic structural diagram of another device for demodulating an OFDM signal based on compressive sensing according to an embodiment of the disclosure.

Referring to FIG. 9, which is a schematic structural diagram of another device for demodulating an OFDM signal based on compressive sensing according to an embodiment of the disclosure. The demodulation device 2 includes a processor 71, a memory 72, an input device 73, and an output device 74. The demodulation device 2 may include one or more processors 71, and one processor 61 is taken as an example in FIG. 9. In some embodiments of the disclosure, the processor 71, the memory 72, the input device 73 and the output device 74 may be connected via a bus or other ways, and the bus connection is taken as an example in FIG. 9.

A block of program code is stored in the memory 72, and the processor 71 is configured to call the program code stored in the memory 72 to:

receive a high-frequency signal transmitted by a transmitter, where a sampling interval $T_{sampleOFDM}=T_s/k$ of an OFDM baseband signal corresponding to the high-frequency signal is integral multiples of $T_{nyq}$ when being modulated by the transmitter, where $T_s$ is a duration of valid data in the OFDM baseband signal, k is the number of subcarriers in the OFDM baseband signal, and $T_{nyq}$ is a length of a minimum timeslot during which the periodic square signal maintains a high level or a low level;

divide the high-frequency signal into m branches;

multiply each of the m branches with a periodic square signal with a period of $T_p$ to obtain m mixed signals;

filter and sample each of the m mixed signals to obtain a sampling vector;

derive a frequency-domain sparse vector from the sampling vector according to a compressive sensing signal reconstruction algorithm; and reconstruct information symbol in the OFDM baseband signal corresponding to the high-frequency signal based on a non-zero term of the frequency-domain sparse vector.

In some embodiments of the disclosure, the step of the processor 71 filtering and sampling each of the m mixed signals to obtain a sampling vector includes:

the processor 71 filters and samples each of the m mixed signals to obtain a sampling vector, where a cut-off frequency for the filtering is $f_s/2$ and a sampling frequency for the sampling is $f_s$, where $f_s=1/T_n$.

By implementing the embodiments of the disclosure, the sampling interval of the OFDM baseband signal of the transmitter is controlled to be the length of the minimum timeslot during which the periodic square signal used by the receiver in demodulation maintains a high level or a low level, the sampling interval of the OFDM baseband signal is controlled to be integral multiples of the length of the minimum timeslot. Based on the baseband signal after the above process, the information symbol input into the receiver is reconstructed by the receiver using the compressive sensing reconstruction algorithm, and the complexity of the algorithm is reduced significantly.

It is to be understood by those skilled in the art that, all or some of the processes in the above methods according to the embodiments of the disclosure implemented by a computer program instructing related hardware. The program may be stored in a computer readable storage medium. The program, when run, may include the processes in the above methods according to the embodiments of the disclosure. The storage medium may be a magnetic disk, an optical disk, a Read-Only memory (ROM), a Random Access Memory (RAM) and the like.

The invention claimed is:

1. A method for modulating an Orthogonal Frequency Division Multiplexing (OFDM) signal based on compressive sensing in a wireless communication system, comprising:
   acquiring, by a transmitter, demodulation parameters of a receiver, wherein the demodulation parameters comprises $T_{nyq}$ of a periodic square signal used by the receiver in sampling, wherein $T_{nyq}$ is a length of a minimum timeslot during which the periodic square signal maintains a high level or a low level;
   performing, by the transmitter, an OFDM modulation on an input information symbol to generate an OFDM baseband signal, and controlling, a sampling interval $T_{sampleOFDM}=T_s/k$ of the OFDM baseband signal to be integral multiples of $T_{nyq}$, wherein $T_s$ is a duration of valid data in the OFDM baseband signal, and k is a total number of subcarriers in the OFDM baseband signal; and
   up-converting, by the transmitter, the OFDM baseband signal and transmitting the up-converted OFDM baseband signal to the receiver.

2. The method according to claim 1, wherein a process of controlling, by the transmitter, the sampling interval $T_{sampleOFDM}=T_s/k$ of the OFDM baseband signal to be integral multiples of $T_{nyq}$ comprises:
   controlling, by the transmitter, the sampling interval of the OFDM baseband signal to meet $T_{sampleOFDM}=T_s/k=T_p$, wherein $T_p$ is a period of the periodic square signal.

3. The method according to claim 1, further comprising:
   determining, by the transmitter, whether a frequency bandwidth of a subcarrier in the OFDM baseband signal is greater than a rated bandwidth B; and setting the subcarrier to be zero in a case that the frequency bandwidth of the subcarrier in the OFDM baseband signal is greater than the rated bandwidth B.

4. The method according to claim 2, further comprising:
   determining, by the transmitter, whether a frequency bandwidth of a subcarrier in the OFDM baseband signal is greater than a rated bandwidth B; and setting the subcarrier to be zero in a case that the frequency bandwidth of the subcarrier in the OFDM baseband signal is greater than the rated bandwidth B.

5. The method according to claim 3, wherein a process of acquiring, by the transmitter, the demodulation parameters of the receiver comprises:
   receiving, by the transmitter, signaling information comprising demodulation parameters transmitted from the receiver; and
   parsing, by the transmitter, the signaling information to obtain the demodulation parameters.

6. A method for demodulating an Orthogonal Frequency Division Multiplexing (OFDM), signal based on compressive sensing in a wireless communication system, comprising:
   receiving a high-frequency signal transmitted from a transmitter, wherein a sampling interval $T_{sampleOFDM}=T_s/k$ of an OFDM baseband signal corresponding to the high-frequency signal is integral multiples of $T_{nyq}$ when being modulated by the transmitter, wherein $T_s$ is a duration of valid data in the OFDM baseband signal, k is a total number of subcarriers in the OFDM baseband signal, and $T_{nyq}$ is a length of a minimum timeslot during which a periodic square signal maintains a high level or a low level;
   dividing the high-frequency signal into m branches;
   multiplying each of the m branches with a periodic square signal with a period of $T_p$ to obtain m mixed signals;
   filtering and sampling each of the m mixed signals to obtain a sampling vector;
   deriving a frequency-domain sparse vector from the sampling vector according to a compressive sensing signal reconstruction algorithm; and
   reconstructing information symbol in the OFDM baseband signal corresponding to the high-frequency signal based on a non-zero term of the frequency-domain sparse vector.

7. The method according to claim 6, wherein the periodic square signal is a random periodic square signal.

8. The method according to claim 6, wherein a process of filtering and sampling each of the m mixed signals to obtain the sampling vector comprises:
   filtering and sampling each of the m mixed signals to obtain the sampling vector;
   wherein a cut-off frequency for the filtering is $f'_s/2$ and a sampling frequency for the sampling is $f'_s$, wherein $f'_s=1/T_p$.

9. The method according to claim 7, wherein the process of filtering and sampling each of the m mixed signals to obtain the sampling vector comprises:
   filtering and sampling each of the m mixed signals to obtain the sampling vector; wherein a cut-off frequency for the filtering is $f'_s/2$ and a sampling frequency for the sampling is $f'_s$, wherein $f'_s=1/T_p$.

10. A transmitter in a wireless communication system, comprising:
    an acquisition module, configured to acquire demodulation parameters of a receiver, wherein the demodulation parameters comprises $T_{nyq}$ of a periodic square signal used by the receiver in sampling, wherein $T_{nyq}$ is a length of a minimum timeslot during which the periodic square signal maintains a high level or a low level;
    a control module, configured to perform an Orthogonal Frequency Division Multiplexing (OFDM) modulation on an input information symbol to generate an OFDM baseband signal, and control a sampling interval $T_{sampleOFDM}=T_s/k$ of the OFDM baseband signal to be integral multiples of $T_{nyq}$, where $T_s$ is a duration of valid data in the OFDM baseband signal, and k is a total number of subcarriers in the OFDM baseband signal; and
    a transmission module, configured to up-convert the OFDM baseband signal and transmit the up-converted OFDM baseband signal to the receiver.

11. The transmitter according to claim 10, wherein the control module is further configured to control the sampling interval of the OFDM baseband signal to meet $T_{sampleOFDM}=T_s/k=T_p$, wherein $T_p$ is a period of the periodic square signal.

12. The transmitter according to claim 10, further comprising:
- a bandwidth adjustment module, configured to determine whether a frequency bandwidth of a subcarrier in the OFDM baseband signal is greater than a rated bandwidth B, and set the subcarrier to be zero in a case that the frequency bandwidth of the subcarrier in the OFDM baseband signal is greater than the rated bandwidth B.

13. The transmitter according to claim 11, further comprising:
- a bandwidth adjustment module, configured to determine whether a frequency bandwidth of a subcarrier in the OFDM baseband signal is greater than a rated bandwidth B, and set the subcarrier to be zero in a case that the frequency bandwidth of the subcarrier in the OFDM baseband signal is greater than the rated bandwidth B.

14. The transmitter according to claim 12, wherein the acquisition module comprises:
- a signaling reception unit, configured to receive signaling information comprising demodulation parameters transmitted from the receiver; and
- a parameter parsing unit, configured to parse the signaling information to obtain the demodulation parameters.

* * * * *